UNITED STATES PATENT OFFICE.

E. J. FRASER, OF SAN FRANCISCO, CALIFORNIA, ASSIGNOR TO SIDNEY A. STEVENS, OF PHILADELPHIA, PENNSYLVANIA.

IMPROVEMENT IN CARBURETING APPARATUS.

Specification forming part of Letters Patent No. 67,971, dated August 20, 1867; reissue No. 6,376, dated April 13, 1875; application filed March 11, 1875.

*To all whom it may concern:*

Be it known that I, E. J. FRASER, formerly of Erie, Pennsylvania, now of San Francisco, California, have invented a new and Improved Carbureting Apparatus; and I do hereby declare that the following is a full, clear, and exact description thereof, which will enable those skilled in the art to make and use the same, reference being had to the accompanying drawings, forming part of this specification.

This invention relates to a new and useful method of charging atmospheric air with the vapor of volatile liquids or hydrocarbon oils, whereby the air is rendered inflammable and fitted for illuminating purposes; and the invention consists in forcing the air into the carbureting-chamber by means of a pump or blower of any description, and in passing it over inclined surfaces and through perforated retarding plates or curtains when in contact with the vapor of such volatile liquids, as will be hereinafter described.

The drawing represents a vertical section of the apparatus, showing the parts of which it is composed, and the manner of their combination.

Similar letters of reference indicate corresponding parts.

A represents the carbureting-vessel, which is placed within another vessel, marked B. This vessel B contains benzine, gasoline, or some equivalent liquid. The vessel A is open at the bottom, with its lower edge cut away, so as to allow free communication between the two. It is also shorter and of less diameter than B, so that there is a space above it, and also all around it. It also has a perforated top, through which the air is made to pass. This carbureting-chamber is annular in form, as seen in the drawing. C is a hollow cylinder, the interior of which has no connection with the carbureting-chamber A, but which is designed to contain hot water at certain seasons of the year, or on certain occasions. Around the cylinder C, in the annular space A, there is a plate-scroll, marked D, which forms a sinuous passage for the air as it ascends through the carbureter. To retard the current of air and hold it in contact with the vapor for a longer time, there is a number of perforated plates or curtains, D′, placed in this passage, through which the air is compelled to pass, as seen in the drawing. The liquid which is carried up through the carbureter with the air can return through the space between the two vessels. After the air thus carbureted passes through the perforated top of the vessel A, it is conducted into a gasometer through the pipe E. F represents the gasometer. G is the air-pipe, and H is a bellows or blower, by which the air is forced into the carbureter. The air is discharged into the bottom of the carbureter, as seen in the drawing. This whole carbureting apparatus is sunk into the ground, and is contained in a casing, marked J.

It will be noticed that this casing is deeper and of greater diameter than the vessel B, so that there is a space, L, and a stratum of dead air all around as well as on top of the vessels A and B. K indicates the surface of the ground.

By thus sinking the apparatus in the ground the temperature of the carbureting-liquid is preserved nearly uniform throughout the year. In the coldest weather, or when the benzine or other liquid has, in a measure, lost its volatile properties, the cylinder C may be filled with hot water through the tube *m*, which is connected therewith. N is the pump, by which the water may be withdrawn. It is the ordinary liquid-pump, and may be used to withdraw the benzine or other liquid from the carbureting-vessel when it is desired to remove it.

Having thus described my invention, I claim as new and desire to obtain by Letters Patent—

1. The vessels A and B, the water-cylinder C, the plate-coil D, and the retarding-curtains D′, constructed and combined substantially as shown and described, for the purposes set forth.

2. In combination with the vessels A and B, water-cylinder C, plate-coil D, and retarding-curtains D′, the air-pipe G, substantially as and for the purposes described.

3. The combination of an air-forcing apparatus, an air-pipe, a carbureting-vessel, and a delivery-pipe, said air-forcing apparatus and said carbureting-vessel being separated by impervious material, through which said air-pipe, to connect the last-mentioned two parts, is passed, said carbureting-vessel being located by itself in a vault under ground, outside the place of delivery of the carbureted air, said delivery-pipe being passed from said carbureting-vessel through the ground to the place of delivery of the carbureted air, in the manner and for the purposes substantially as set forth.

E. J. FRASER.

Witnesses:
EDWARD J. PRINGLE,
ROBERT Y. HAYNE.